United States Patent [19]
van Ommen et al.

[11] Patent Number: 5,236,872
[45] Date of Patent: Aug. 17, 1993

[54] METHOD OF MANUFACTURING A SEMICONDUCTOR DEVICE HAVING A SEMICONDUCTOR BODY WITH A BURIED SILICIDE LAYER

[75] Inventors: Alfred H. van Ommen; Jozef J. M. Ottenheim, both of Eindhoven, Netherlands; Erik H. A. Dekempeneer, Wijnegem, Belgium; Gerrit C. van Hoften, Eindhoven, Netherlands

[73] Assignee: U.S. Philips Corp., New York, N.Y.

[21] Appl. No.: 848,612

[22] Filed: Mar. 9, 1992

[30] Foreign Application Priority Data

Mar. 21, 1991 [EP] European Pat. Off. ........ 91200635.0

[51] Int. Cl.$^5$ .................... H01L 21/24; H01L 21/265
[52] U.S. Cl. ..................... 437/200; 437/24; 437/26; 437/27; 148/DIG. 1; 148/DIG. 147
[58] Field of Search ............. 437/200, 24, 26, 27; 148/DIG. 1, DIG. 19, DIG. 147

[56] References Cited

U.S. PATENT DOCUMENTS

| | | |
|---|---|---|
| 3,726,719 | 4/1973 | Brack et al. |
| 4,096,622 | 6/1978 | MacIver .................. 148/DIG. 147 |
| 4,558,507 | 12/1985 | Okabayashi et al. ...... 148/DIG. 147 |
| 4,577,396 | 3/1986 | Yamamoto et al. ................ 437/202 |
| 4,816,421 | 3/1989 | Dynes et al. ............... 437/26 |
| 4,875,082 | 10/1989 | Bredthauer . |
| 5,122,479 | 6/1992 | Audet et al. ........... 437/200 |

FOREIGN PATENT DOCUMENTS

0259282 3/1988 European Pat. Off. .
0271232 6/1988 European Pat. Off. .

OTHER PUBLICATIONS

Sanchez, et al., "Silicide Formation by High Dose ..." Proc. of Mat. Res. Soc. Symp., vol. 51, 1986, pp. 439-444.
Rausch, et al., "Palladium Silicide Contact ...", IBM Tech. Disc. Bull., vol. 24, No. 7A, Dec. 1981, p. 3453.
"Thermal Regrowth of Silicon After High-dose Ar+ Implantation", by Kalitzova et al, Nuclear Instruments & Methods in Physics Research Section B, vol. B17, No. 4, Nov. 1986, pp. 331-333.
"Silicide Formation by Direct Metal Implantation", by Kozicki, Extended Abstracts/Electrochemical Society, vol. 87-2, 1987, pp. 968-969.

Primary Examiner—T. N. Quach
Attorney, Agent, or Firm—Steven R. Biren

[57] ABSTRACT

A method of manufacturing a semiconductor device in which a thin buried silicide layer is formed by implantation includes the step of first forming an amorphous layer by implantation, which layer is then converted into the buried silicide layer by a heat treatment. A sufficiently thin buried silicide layer, of about 10 nm thickness, can be obtained in this manner, and the resulting structure is suitable, for example, for the manufacture of a metal-base transistor.

5 Claims, 1 Drawing Sheet

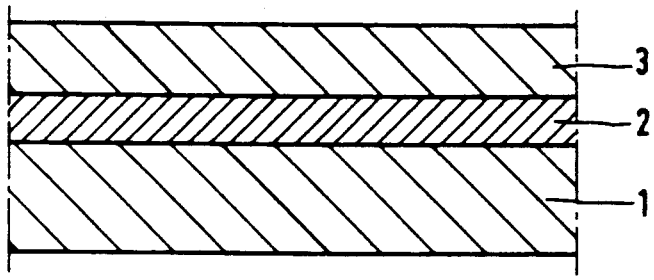

METHOD OF MANUFACTURING A SEMICONDUCTOR DEVICE HAVING A SEMICONDUCTOR BODY WITH A BURIED SILICIDE LAYER

BACKGROUND OF THE INVENTION

The invention relates to a method of manufacturing a semiconductor device whereby ions are implanted in a monocrystalline silicon body in order to obtain a buried silicide layer.

The general method indicated above is known from European Patent Application no. 271.232.

The buried layers obtained by means of the known method have the disadvantage that they are too thick for many applications. They are unsuitable for, for example, so-called metal-base transistors in which the silicide layer serving as the base must be thinner than about 10 nm.

SUMMARY OF THE INVENTION

The invention has for its object inter alia to avoid the above disadvantage at least to a considerable degree and is based on the insight that it is effective first to form an amorphous buried layer in the implantation.

According to the invention, therefore, the method mentioned above is characterized in that first a buried amorphous layer is formed during the implantation and that subsequently the buried silicide layer is formed from the amorphous layer by a heat treatment.

Ions are often more soluble in amorphous silicon than in monocrystalline silicon, and the subsequent heat treatment then forms a silicide layer whose thickness is smaller than that of the amorphous layer originally formed.

The amorphous layer may be formed by implantation of a different element than that with which silicon of the silicon body is to form the buried silicide layer subsequently. The element with which silicon forms the silicide is then to be implanted separately.

For example, the amorphous layer can be formed by implantation of silicon or a rare gas.

Preferably, the amorphous layer is formed by implantation of the element with which silicon of the silicon body is to form the buried silicide layer subsequently, for example, cobalt.

BRIEF DESCRIPTION OF THE DRAWING

The invention will now be explained with reference to an embodiment and the accompanying FIGURE, which diagrammatically and in cross-section represents a portion of a semiconductor device in a stage of manufacture by means of the method according to the invention.

DESCRIPTION OF THE PREFERRED EMBODIMENT

In the present method, the ultimate aim is to manufacture a semiconductor device, for example, a metal-base transistor in which ions are implanted in a monocrystalline silicon body 1 (see the FIGURE) in order to obtain a buried silicide layer 2.

According to the invention, a buried amorphous layer is first formed in the implantation, after which the buried silicide layer 2 is formed by a heat treatment.

For example, the amorphous layer is formed by implantation of a different element than that with which silicon of the silicon body is to form the buried silicide layer 2 subsequently. This other element may be, for example, a rare gas, for example argon, or it may be silicon.

An amorphous silicon layer may be formed, for example, by means of a random implantation with a dose of $2.9 \times 10^{14}$ silicon atoms per $cm^2$ at an energy of 500 keV at a temperature of 80 K., whereby the amorphous silicon layer is given a thickness of 540 mm underneath a 200 nm thick top layer of monocrystalline silicon 3.

To obtain a cobalt disilicide ($CoSi_2$) layer having a thickness of 10 nm, a cobalt implantation is necessary of approximately $2.6 \times 10^{16}$ cobalt atoms per $cm^2$. This may be done in a conventional manner.

It should be noted that amorphous silicon provides a high solubility for cobalt atoms.

During the ensuing heat treatment, the amorphous silicon layer of 540 nm is converted into a cobalt silicide layer of 10 nm. The heat treatment takes, for example, four hours at 575° C. and 0.5 hour at 1,000° C.

In the metal-base transistor, which may be manufactured in conventional manner in all other respects, the layer 3 acts as the emitter and the silicon body 1 as the collector.

The present invention is not limited to the example given, but may be varied in many ways by those skilled in the art. Thus the amorphous layer may also be formed by implantation of, for example, cobalt atoms. Instead of a cobalt disilicide layer, for example, a buried nickle disilicide layer may be formed. It is also possible to manufacture a permeable-base transistor by means of the method according to the invention.

We claim:

1. A method of manufacturing a semiconductor device, in which a buried metal silicide layer is formed in a monocrystalline silicon body, comprising:
   implanting ions of an element different from said metal in said silicon body to form a buried amorphous layer in said silicon body; then
   implanting metal ions in said buried amorphous layer; and then
   heat treating said silicon body so that said metal ions react with silicon in said amorphous layer to form said buried metal silicide layer.

2. A method as claimed in claim 1, wherein silicon ions are implanted in said silicon body.

3. A method as claimed in claim 1, wherein ions of a rare gas are implanted in said silicon body.

4. A method as claimed in claim 1, wherein cobalt ions are implanted in said buried amorphous layer.

5. A method as claimed in claim 1, wherein nickel ions are implanted in said buried amorphous layer.

* * * * *